(12) United States Patent
Shimada et al.

(10) Patent No.: US 12,456,636 B2
(45) Date of Patent: Oct. 28, 2025

(54) HEAT INSULATION STRUCTURE, SUBSTRATE PROCESSING APPARATUS, METHOD OF MANUFACTURING SEMICONDUCTOR DEVICE AND SUBSTRATE PROCESSING METHOD

(71) Applicant: Kokusai Electric Corporation, Tokyo (JP)

(72) Inventors: Hironori Shimada, Toyama (JP); Tomoshi Taniyama, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 956 days.

(21) Appl. No.: 17/553,582

(22) Filed: Dec. 16, 2021

(65) Prior Publication Data

US 2022/0108900 A1    Apr. 7, 2022

Related U.S. Application Data

(63) Continuation of application No. PCT/JP2019/025525, filed on Jun. 27, 2019.

(51) Int. Cl.
*H01L 21/67* (2006.01)
*C23C 16/46* (2006.01)
(Continued)

(52) U.S. Cl.
CPC ........ *H01L 21/67109* (2013.01); *C23C 16/46* (2013.01); *F27B 17/0025* (2013.01);
(Continued)

(58) Field of Classification Search
CPC ............... H01L 21/67109; C23C 16/46; F27B 17/0025; F27D 1/0033; F27D 5/0037
(Continued)

(56) References Cited

U.S. PATENT DOCUMENTS

| 3,823,567 A | * | 7/1974 | Corini | ............... F25B 21/02 |
| | | | | 62/3.62 |
| 2013/0062035 A1 | * | 3/2013 | Kawakami | ....... H01L 21/67109 |
| | | | | 165/59 |
| 2020/0216958 A1 | | 7/2020 | Saido | |

FOREIGN PATENT DOCUMENTS

| JP | 07-066128 A | 3/1995 |
| JP | 07-078779 A | 3/1995 |
| | (Continued) | |

OTHER PUBLICATIONS

IPOS Office Action in Singapore Application No. 11202113674Y, issued Apr. 11, 2023, 9 pages.
(Continued)

*Primary Examiner* — Elizabeth M Kerr
*Assistant Examiner* — Simpson A Chen
(74) *Attorney, Agent, or Firm* — Edell, Shapiro & Finnan, LLC

(57) ABSTRACT

There is provided a technique capable of shortening a temperature stabilization time in a process chamber by improving a heat insulation performance of a lower portion of the process chamber. A heat insulation structure is arranged in a vicinity of a furnace opening of a heat treatment furnace wherein a temperature gradient is formed at the vicinity of the furnace opening. The heat insulation structure includes a plurality of heat insulation plates with predetermined gaps therebetween. Each heat insulation plate includes a heat shield made of metal; and a seal made of quartz or ceramics and configured to cover a front surface and a rear surface of the heat shield. The heat shield is arranged in a vacuum cavity provided in the seal.

10 Claims, 7 Drawing Sheets

(51) Int. Cl.
  *F27B 17/00* (2006.01)
  *F27D 1/00* (2006.01)
  *F27D 5/00* (2006.01)
  *H01L 21/324* (2006.01)

(52) U.S. Cl.
  CPC ......... *F27D 1/0033* (2013.01); *F27D 5/0037* (2013.01); *H01L 21/324* (2013.01)

(58) Field of Classification Search
  USPC .......................................... 373/75; 219/201
  See application file for complete search history.

(56) References Cited

FOREIGN PATENT DOCUMENTS

| | | |
|---|---|---|
| JP | 09-14575 A | 1/1997 |
| JP | 09-148315 A | 6/1997 |
| JP | 11-97360 A | 4/1999 |
| JP | 2002-25994 A | 1/2002 |
| JP | 2002-25995 A | 1/2002 |
| JP | 2004-186533 A | 7/2004 |
| JP | 2004-214283 A | 7/2004 |
| JP | 2005-163848 A | 6/2005 |
| JP | 2006-228813 A | 8/2006 |
| JP | 2008-262959 A | 10/2008 |
| JP | 2016-84879 A | 5/2016 |
| WO | 2016190176 A1 | 12/2016 |
| WO | 2019/053807 A1 | 3/2019 |
| WO | 2019186681 A1 | 10/2019 |

OTHER PUBLICATIONS

International Search Report in corresponding International Patent Application No. PCT/JP2019/025525, mailed Sep. 24, 2019, with English translation.

* cited by examiner

FIG. 4A
FIG. 4B
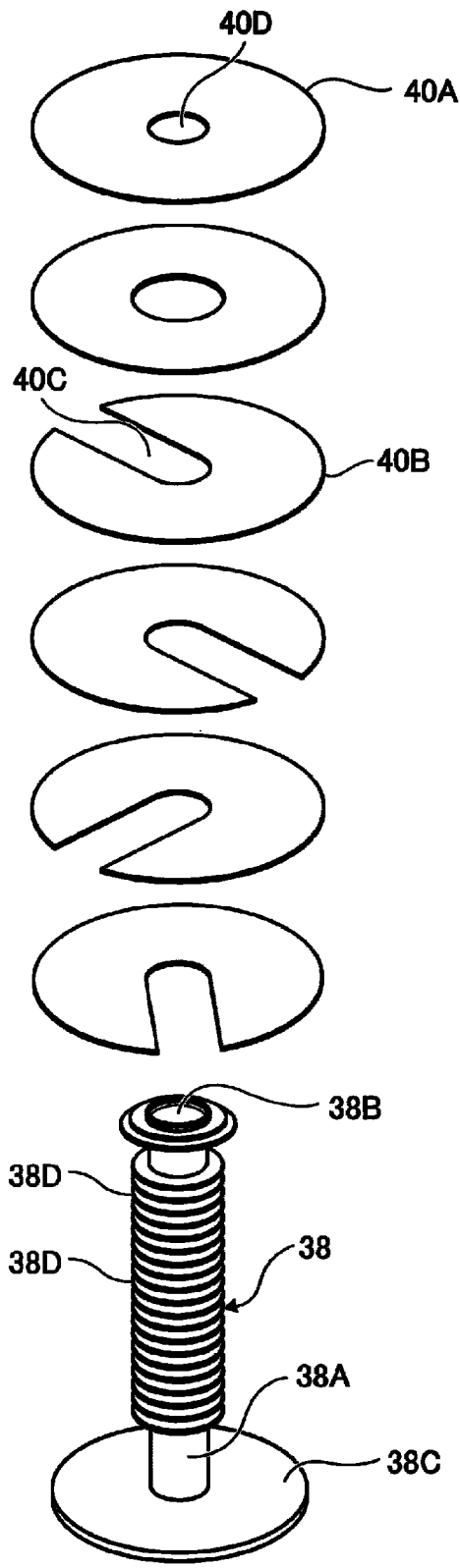
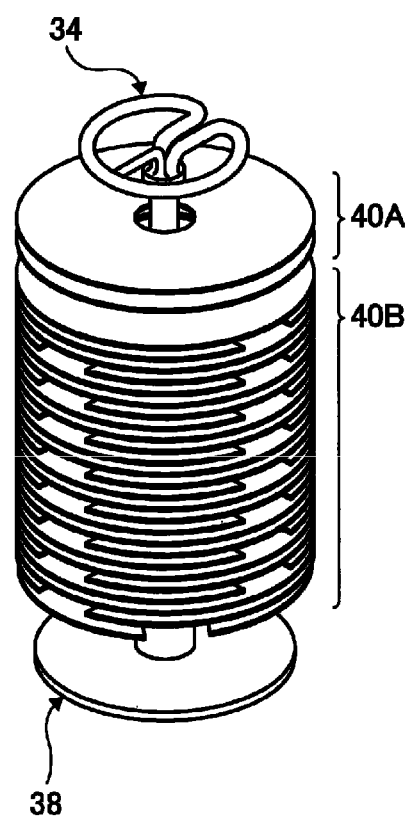

HEAT INSULATION STRUCTURE, SUBSTRATE PROCESSING APPARATUS, METHOD OF MANUFACTURING SEMICONDUCTOR DEVICE AND SUBSTRATE PROCESSING METHOD

CROSS REFERENCE TO RELATED APPLICATIONS

This application is a continuation of International Application No. PCT/JP2019/025525, filed on Jun. 27, 2019, the entire contents of which are hereby incorporated by reference.

TECHNICAL FIELD

The present disclosure relates to a heat insulation structure, a substrate processing apparatus, a method of manufacturing a semiconductor device and a substrate processing method.

BACKGROUND

In a heat treatment process of a substrate (also referred to as a "wafer") in a manufacturing process of a semiconductor device, for example, a substrate processing apparatus such as a vertical type substrate processing apparatus may be used. In the vertical type substrate processing apparatus, a plurality of substrates are charged into a substrate retainer of the vertical type substrate processing apparatus and supported in a vertical direction by the substrate retainer, and the substrate retainer is loaded into a process chamber of the vertical type substrate processing apparatus. Thereafter, a process gas is introduced into the process chamber while the plurality of substrates are heated by a heater provided outside the process chamber to perform a substrate processing such as a film-forming process on the plurality of substrates.

In the vertical type substrate processing apparatus as described above, a subsidiary heater (hereinafter, also referred to as a "sub heater") may be installed in a lower portion of the process chamber where an amount of a heat released to an outside of a furnace of the vertical type substrate processing apparatus is great, and the plurality of substrates may be heated using both of a main heater provided outside the process chamber (that is, the heater described above) and the sub heater.

However, when the sub heater is provided as described above, it takes time to stabilize a temperature of the process chamber unless a temperature elevation by the sub heater follows that of the main heater. In addition, since the sub heater heats a center of each of the plurality of substrates, a temperature distribution on a surface of each of the plurality of substrates may become non-uniform.

SUMMARY

Described herein is a technique capable of shortening a temperature stabilization time in a process chamber by improving a heat insulation performance of a lower portion of the process chamber.

According to one or more embodiments of the present disclosure, there is provided a technique that includes: a heat insulation structure arranged in a vicinity of a furnace opening of a heat treatment furnace with a temperature gradient, including: a plurality of heat insulation plates with predetermined gaps therebetween, wherein each heat insulation plate includes: a heat shield made of metal; and a seal made of quartz or ceramics and configured to cover a front surface and a rear surface of the heat shield, and wherein the heat shield is arranged in a vacuum cavity provided in the seal.

BRIEF DESCRIPTION OF THE DRAWINGS

FIGS. 4A and 4B are perspective views schematically illustrating a heat insulation structure of the substrate processing apparatus preferably used in the embodiments of the present disclosure.

DETAILED DESCRIPTION

Hereinafter, one or more embodiments (also simply referred to as "embodiments") according to the technique of the present disclosure will be described with reference to FIG. 1.

Figure 1:
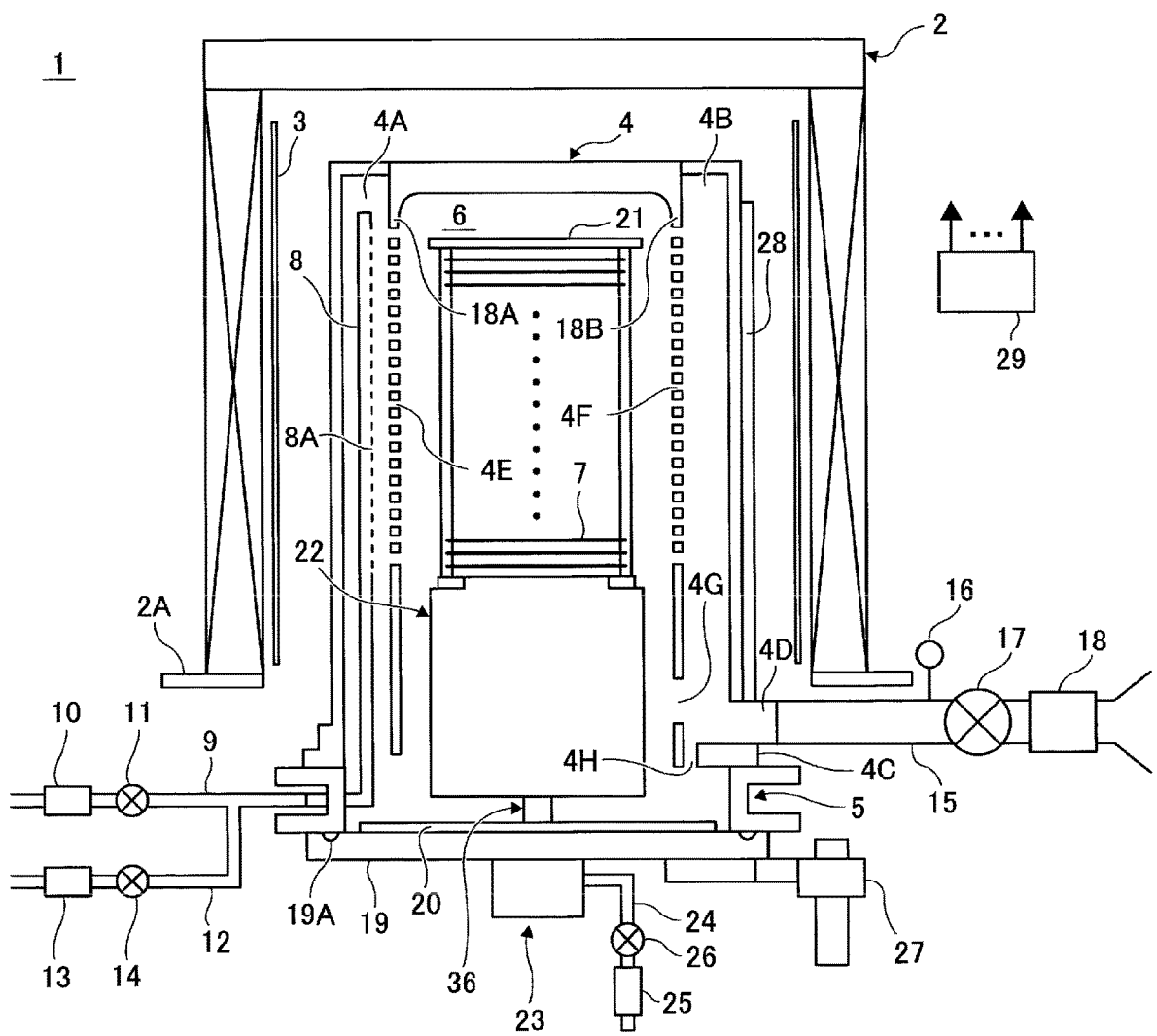
FIG. 1 is a diagram schematically illustrating a vertical cross-section of a vertical type furnace of a substrate processing apparatus preferably used in one or more embodiments of the present disclosure.

As shown in FIG. 1, a substrate processing apparatus 1 according to the present embodiments is configured as a vertical type heat treatment apparatus capable of performing a heat treatment process in manufacturing a semiconductor integrated circuit, and includes a furnace (also referred to as a "heat treatment furnace") 2. For example, the furnace 2 is configured as an electric furnace of a cylindrical shape, and is installed perpendicular to an installation floor of the substrate processing apparatus 1 while being supported by a heater base 2A serving as a support plate. A heater 3 serving as a first heater is provided on an inner surface side of the furnace 2 in order to uniformly heat an inside of the furnace 2. The heater 3 also functions as an activator (also referred to as an "exciter") capable of activating (or exciting) a gas by the heat as described later.

A reaction tube 4 constituting a reaction vessel (also referred to as a "process vessel") is arranged inside the furnace 2. For example, the reaction tube 4 is made of a heat resistant material such as quartz ($SiO_2$) that transmits an infrared light or silicon carbide (SiC) close to a black body. The reaction tube 4 is of a cylindrical shape with an open lower end and a closed upper end. A gas supply space (which is a supply duct) 4A and a gas exhaust space (which is an exhaust duct) 4B, which protrude outward from the reaction tube 4 and face each other, are provided outside the reaction tube 4. In addition, a flange 4C protruding outward from the reaction tube 4 is provided at the lower end of the reaction tube 4. The flange 4C is connected to a manifold 5, which is a component provided between the flange 4C and a lid 19, via an O-ring 5A serving as a seal.

A process chamber 6 is formed in a hollow portion of the reaction tube 4. The process chamber 6 is configured to accommodate a plurality of wafers including a wafer 7 by a boat 21 described later. Hereinafter, the plurality of wafers including the wafer 7 may also be simply referred to as "wafers 7". The process chamber 6, the gas supply space 4A and the gas exhaust space 4B are separated by the reaction tube 4 (that is, by an inner wall of the reaction tube 4).

The manifold 5 is of a cylindrical shape, and is made of a metal. The manifold 5 is provided so as to support the lower end of the reaction tube 4. An inner diameter of the manifold 5 is set to be greater than an inner diameter of the reaction tube 4 (that is, an inner diameter of the flange 4C). As a result, it is possible to provide an annular space described later between the lower end (flange 4C) of the reaction tube 4 and the lid 19 provided at the lower end (one end) of the reaction tube 4.

One or more nozzles 8 are installed in the gas supply space 4A. One or more gas supply pipes 9 configured to supply a process gas such as a source gas are connected to the one or more nozzles 8 through the manifold 5, respectively. One or more mass flow controllers (MFCs) 10 serving as flow rate controllers and one or more valves 11 serving as opening/closing valves are sequentially installed on flow paths of the one or more gas supply pipes 9, respectively, from upstream sides to downstream sides thereof. One or more gas supply pipes 12 configured to supply an inert gas are connected to the one or more gas supply pipes 9, respectively, at downstream sides of the one or more valves 11. One or more MFCs 13 and one or more valves 14 are sequentially installed at the one or more gas supply pipes 12, respectively, from upstream sides to downstream sides thereof. Hereinafter, the one or more nozzles 8 may also be collectively or individually referred to as a "nozzle 8", the one or more gas supply pipes 9 may also be collectively or individually referred to as a "gas supply pipe 9", the one or more gas supply pipes 12 may also be collectively or individually referred to as a "gas supply pipe 12", the one or more MFCs 10 may also be collectively or individually referred to as an "MFC 10", the one or more valves 11 may also be collectively or individually referred to as a "valve 11", the one or more MFCs 13 may also be collectively or individually referred to as an "MFC 13", and the one or more valves 14 may also be collectively or individually referred to as a "valve 14". A process gas supplier serving as a process gas supply system is constituted mainly by the gas supply pipe 9, the MFC 10 and the valve 11. An inert gas supplier serving as an inert gas supply system is constituted mainly by the gas supply pipe 12, the MFC 13 and the valve 14. In addition, the process gas supplier (process gas supply system) may further include the gas supply pipe 12, the MFC 13 and the valve 14.

The nozzle 8 is provided in the gas supply space 4A so as to extend straight from a lower portion of the reaction tube 4 toward an upper portion of the reaction tube 4. One or more gas supply holes 8A through which a gas such as the process gas is supplied may be provided on an upper end or a side surface of the nozzle 8. Hereinafter, the one or more gas supply holes 8A may also be collectively or individually referred to as "gas supply holes 8A" or a "gas supply hole 8A". The gas supply holes 8A are open toward a center of the reaction tube 4 such that the gas can be ejected toward the wafers 7 through the gas supply holes 8A. A plurality of supply slits 4E of a horizontally elongated slit shape are provided on the inner wall of the reaction tube 4 between the gas supply space 4A and the process chamber 6 such that the plurality of supply slits 4E are arranged in a multistage manner in the vertical direction with predetermined gaps therebetween corresponding to the wafers 7.

A plurality of exhaust slits 4F of a horizontally elongated slit shape, which serve as a first exhaust structure (first exhaust port), are provided on the inner wall of the reaction tube 4 between the gas exhaust space 4B and the process chamber 6 in a manner corresponding to the plurality of supply slits 4E such that the plurality of exhaust slits 4F are arranged in a multistage manner in the vertical direction. An exhaust port 4D communicating with the gas exhaust space 4B is provided in the vicinity of the lower end of the reaction tube 4. An exhaust pipe 15 through which an inner atmosphere of the process chamber 6 is exhausted is connected to the exhaust port 4D. An exhaust port 4G is provided on the inner wall of the reaction tube 4 below the gas exhaust space 4B (that is, a wall between the gas exhaust space 4B and the process chamber 6). In addition, the flange 4C is also provided with an exhaust port 4H through which the process chamber 6 communicates with a lower end of the gas exhaust space 4B. The exhaust ports 4G and 4H are configured such that a purge gas described later is exhausted therethrough.

A vacuum pump 18 serving as a vacuum exhaust apparatus is connected to the exhaust pipe 15 through a pressure sensor 16 and an APC (Automatic Pressure Controller) valve 17. The pressure sensor 16 serves as a pressure detector (also referred to as a "pressure meter") to detect an inner pressure of the process chamber 6, and the APC valve 17 serves as a pressure regulator (also referred to as a "pressure controller"). With the vacuum pump 18 in operation, the APC valve 17 may be opened or closed to exhaust (vacuum-exhaust) the inner atmosphere of the process chamber 6 or stop the vacuum exhaust. In addition, with the vacuum pump 18 in operation, an opening degree of the APC valve 17 may be adjusted based on pressure information detected by the pressure sensor 16 in order to control the inner pressure of the process chamber 6. An exhauster (which is an exhaust system) is constituted mainly by the exhaust pipe 15, the APC valve 17 and the pressure sensor 16. The exhauster may further include the vacuum pump 18.

The lid 19 serving as a furnace opening lid capable of airtightly sealing a lower end opening of the manifold 5 is provided under the manifold 5. For example, the lid 19 is made of a metal such as SUS (stainless steel) and a nickel-base alloy, and is of a disk shape. An O-ring 19A serving as a seal is provided on an upper surface of the lid 19 so as to be in contact with a lower end of the manifold 5.

A cover plate 20 configured to protect the lid 19 is provided on the upper surface of the lid 19 at a location inner than a bottom flange of the manifold 5. For example, the cover plate 20 is made of a heat and corrosion resistant material such as quartz, sapphire and SiC, and is of a disk shape. Since the cover plate 20 can retain small mechanical strength, the cover plate 20 may be formed with a small thickness. In addition, the cover plate 20 is not limited to a component prepared independently of the lid 19. For example, the cover plate 20 may be embodied by a film or a layer such as a nitride film coated on an inner surface of the lid 19 and a nitride film formed by modifying the inner surface of the lid 19. The cover plate 20 may further include a wall extending upward along an inner surface of the manifold 5 from a circumferential edge of the cover plate 20.

The boat 21 serving as a substrate retainer is configured to align the wafers 7 (for example, from 25 to 200 wafers) in the vertical direction so as to support the wafers 7 in a multistage manner while the wafers 7 are horizontally oriented with their centers aligned with each other. That is, the boat 21 supports the wafers 7 with predetermined gaps therebetween. The boat 21 is made of a heat resistant material such as quartz and SiC. It is preferable to minimize the inner diameter of the reaction tube 4 as long as the boat 21 can be safely transferred into and out of the reaction tube 4.

A heat insulation structure 22 is disposed at a position in the process chamber 6 below the boat 21 to which the exhaust pipe 15 is connected. Although details will be described later, the heat insulation structure 22 is configured such that the conduction or transmission of the heat tends to be reduced in the vertical direction, and usually a cavity is provided in the heat insulation structure 22. In addition, the heat insulation structure 22 is configured not to leak the radiant heat from above to the lower portion of the reaction tube 4. In addition, an inside of the heat insulation structure 22 may be purged with the purge gas.

A rotator 23 configured to rotate the boat 21 is provided under the lid 19 opposite to the process chamber 6. A gas supply pipe 24 of the purge gas is connected to the rotator 23. An MFC 25 and a valve 26 are sequentially installed at the gas supply pipe 24 from an upstream side to a downstream side of the gas supply pipe 24. A purge gas supplier (which is a purge gas supply system) is constituted mainly by the gas supply pipe 24, the MFC 25 and the valve 26. One purpose of the purge gas is to protect an inside of the rotator 23 (for example, bearings) from the gas such as a corrosive gas used in the process chamber 6. The purge gas is discharged from the rotator 23 along a shaft of the rotator 23 and is guided into the heat insulation structure 22.

A boat elevator 27 is provided outside the reaction tube 4 vertically below the reaction tube 4. The boat elevator 27 serves as an elevating structure (or a transfer structure) capable of elevating and lowering the lid 19. By operating the boat elevator 27, the boat 21 supported by the lid 19 and the wafers 7 accommodated in the boat 21 may be transferred into or out of the process chamber 6.

A temperature detector 28 is installed on an outer wall of the reaction tube 4. The temperature detector 28 may be embodied by a plurality of thermocouples arranged in a vertical array. The state of electric conduction to the heater 3 may be adjusted based on temperature information detected by the temperature detector 28 such that a desired temperature distribution of an inner temperature of the process chamber 6 can be obtained.

A controller 29 is constituted by a computer configured to control the entire substrate processing apparatus 1. The controller 29 is electrically connected to components of the substrate processing apparatus 1 such as the MFCs 10, 13 and 25, the valves 11, 14 and 26, the pressure sensor 16, the APC valve 17, the vacuum pump 18, the heater 3, a cap heater 34 serving as a sub heater (second heater) described later, the temperature detector 28, the rotator 23 and the boat elevator 27, and is configured to receive signals from the components described above or to control the components described above.

Figure 2:
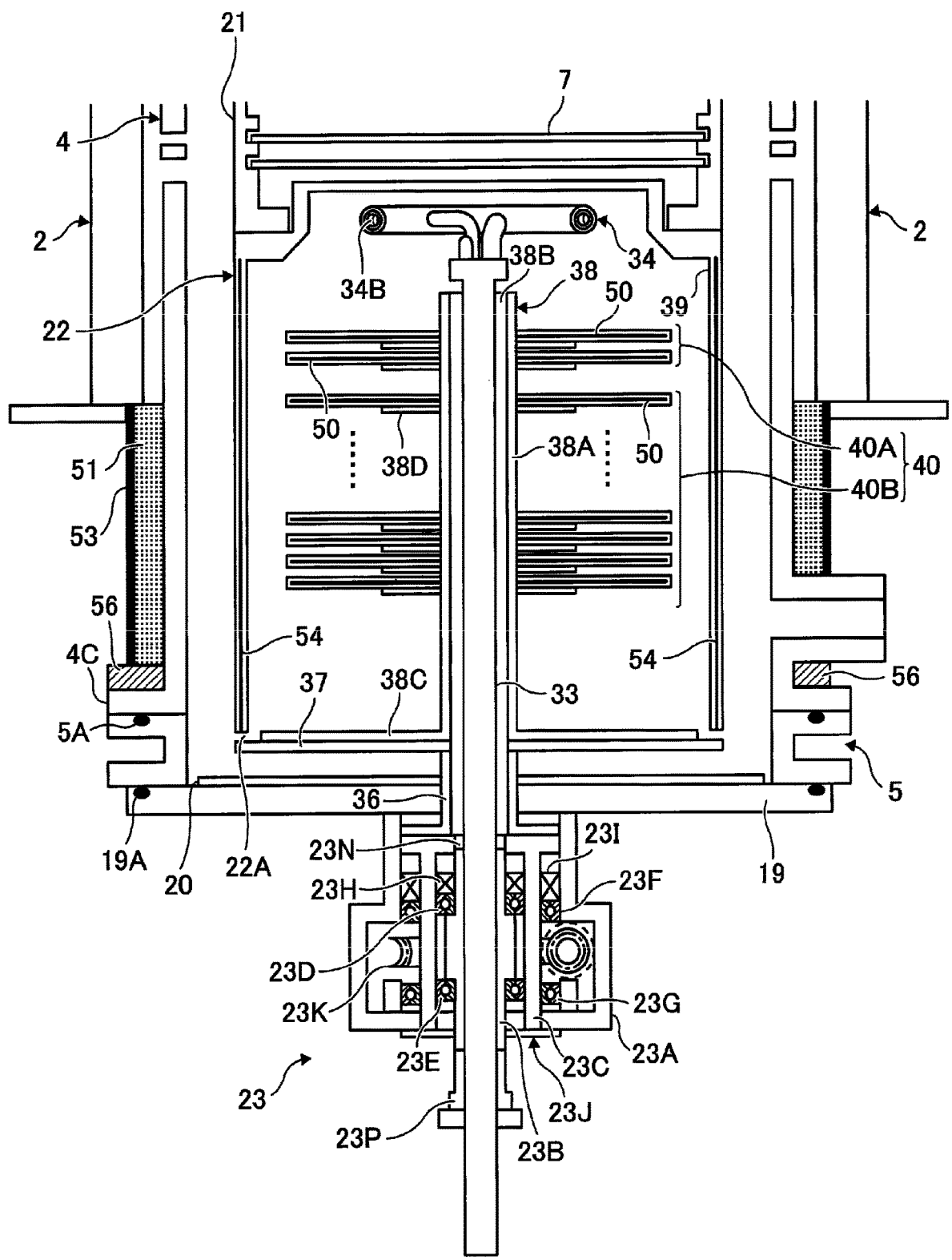
FIG. 2 is a diagram schematically illustrating a vertical cross-section of a cap heater and components around the cap heater of the substrate processing apparatus preferably used in the embodiments of the present disclosure.

FIG. 2 schematically illustrates a cross-section of the heat insulation structure 22 and the rotator 23. The rotator 23 includes a casing (which is a body) 23A. The casing 23A is of a substantially cylindrical shape with an open upper end and a closed lower end. The casing 23A is fixed to a lower surface of the lid 19 with a bolt. From an inside of the casing 23A, an inner shaft 23B of a cylindrical shape and an outer shaft 23C of a cylindrical shape are coaxially arranged in this order in the casing 23A. A diameter of the outer shaft 23C is greater than that of the inner shaft 23B. In addition, the outer shaft 23C may be rotatably supported by a pair of inner bearings 23D and 23E interposed between the outer shaft 23C and the inner shaft 23B and a pair of outer bearings 23F and 23G interposed between the outer shaft 23C and the casing 23A. The inner bearings 23D and 23E constitute a vertically arranged pair, and the outer bearings 23F and 23G constitute another vertically arranged pair. The inner shaft 23B is fixed to the casing 23A so that it cannot rotate.

Magnetic fluid seals 23H and 23I are provided above the inner bearing 23D and the outer bearing 23F (that is, provided at sides of the inner bearing 23D and the outer bearing 23F facing the process chamber 6) to separate the vacuum atmosphere and the air of atmospheric pressure. A worm wheel or a pulley 23K that is driven by a component such as an electric motor (not shown) is mounted at the outer shaft 23C.

A sub heater support column 33 is vertically inserted inside the inner shaft 23B. For example, the sub heater support column 33 is a quartz pipe configured to support the cap heater 34 serving as the sub heater concentrically at an upper end thereof. The cap heater 34 is configured to heat the wafers 7 from thereunder in the process chamber 6. The sub heater support column 33 is supported by a support 23N made of a heat resistant resin at an upper end position of the inner shaft 23B. A portion between an outer surface of the sub heater support column 33 and the inner shaft 23B is sealed by an O-ring (not shown) at a vacuum joint 23P connected to the inner shaft 23B or the casing 23A at a lower portion of the sub heater support column 33.

A rotating shaft 36 of a cylindrical shape is fixed to an upper surface of the outer shaft 23C of a flange shape. The rotating shaft 36 includes a flange (not shown) at a lower end thereof. The sub heater support column 33 penetrates a cavity of the rotating shaft 36. At an upper end of the rotating shaft 36, a rotating table 37 of a disk shape is fixed to the cover plate 20 with a predetermined gap therebetween. A through-hole through which the sub heater support column 33 penetrates is provided at a center of the rotating table 37.

For example, the rotating table 37 is made of a metal such as stainless steel. A heat insulation plate retainer 38 configured to support (hold) a plurality of heat insulation plates 40 and a cover (also referred to as a "pedestal" or a "cap") 39 of a cylindrical shape are placed concentrically on an upper surface of the rotating table 37, and fixed by components such as screws. Hereinafter, the plurality of heat insulation plates 40 may also be collectively or individually referred to as "heat insulation plates 40" or a "heat insulation plate 40".

The cap heater 34 is installed below the boat 21, and is provided closer to the boat 21 than the lid 19 to heat an inside of the reaction tube 4.

Figure 3:
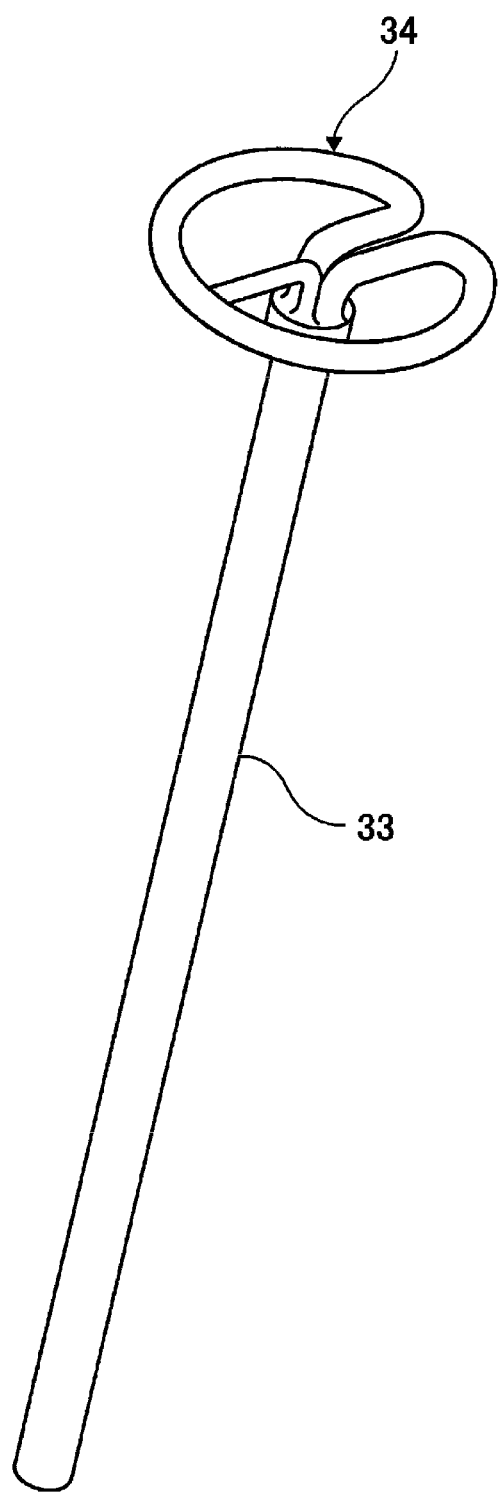
FIG. 3 is a perspective view schematically illustrating the cap heater of the substrate processing apparatus preferably used in the embodiments of the present disclosure.
Figure 5A:
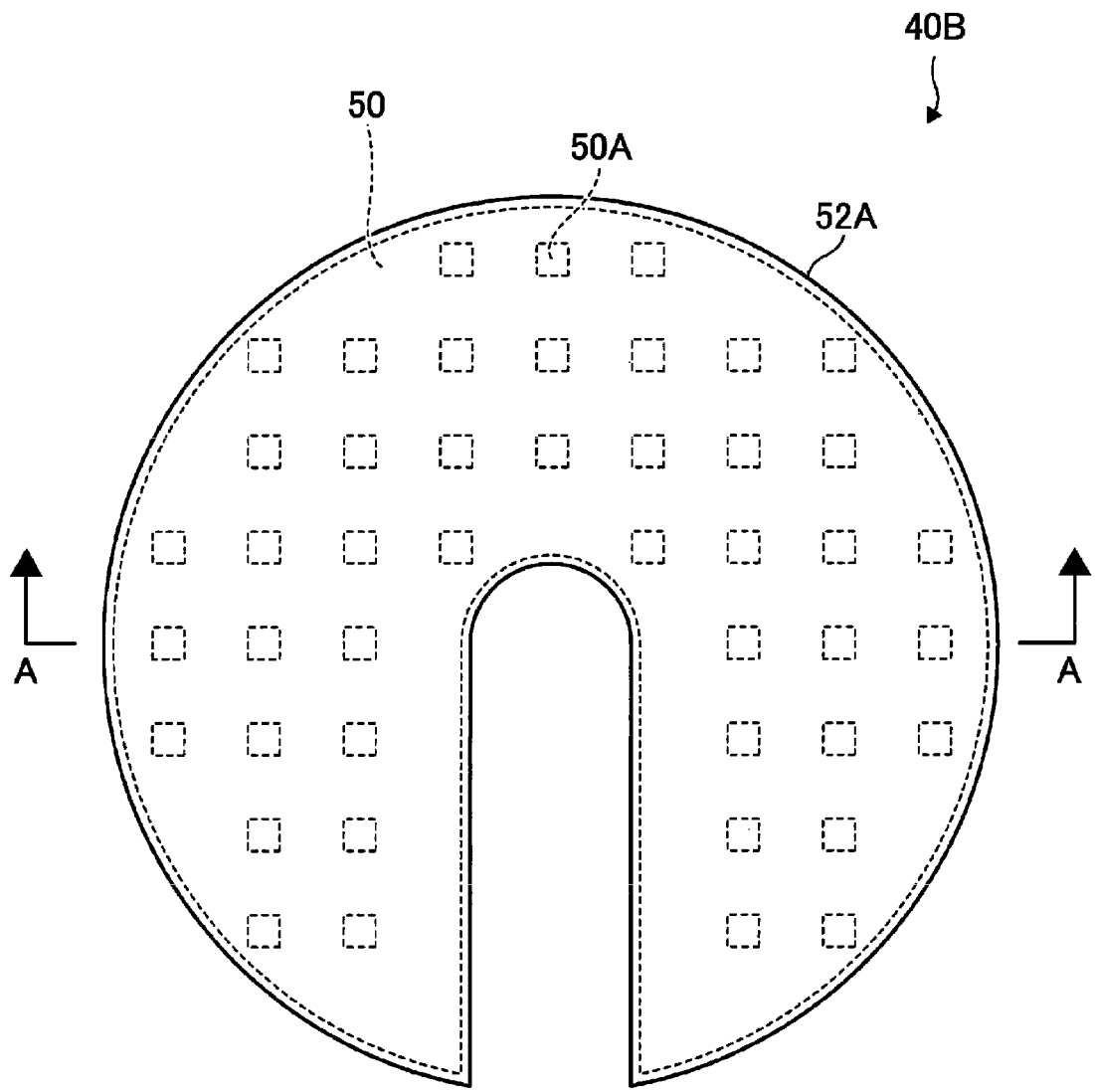
FIG. 5A is a top view schematically illustrating a heat insulation plate constituting the heat insulation structure preferably used in the embodiments of the present disclosure.
Figure 5B:
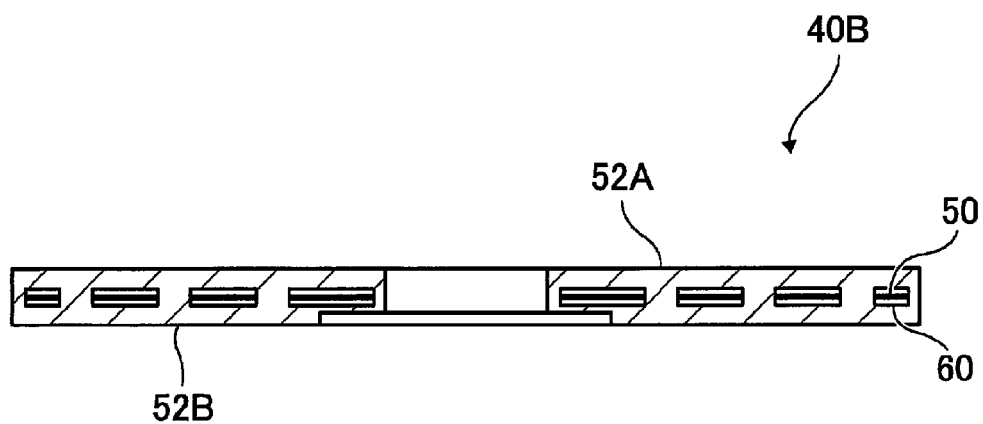
FIG. 5B is a diagram schematically illustrating a vertical cross-section of the heat insulation plate of the substrate processing apparatus preferably used in the embodiments of the present disclosure.

As shown in FIGS. 2 and 3, the cap heater 34 is of a torus shape whose diameter is smaller than a diameter of the wafer 7 and a diameter of the cover 39, and is connected and supported by the sub heater support column 33 so as to be parallel to the wafer 7. A heater wire constituting a heating element 34B serving as a resistance heating element of a coil shape is inserted into the cap heater 34 and the sub heater support column 33. For example, the heating element 34B is made of a material such as an Fe—Cr—Al alloy, molybdenum disilicide (MoSi$_2$) and tungsten.

The cap heater 34 includes an independent lead wire, and its electric conduction can be performed independently. The cap heater 34 is arranged in the heat insulation structure 22 in the vicinity of an upper end of the heat insulation structure 22. In addition, the heat insulation plates 40 are arranged below the cap heater 34. Further, the cap heater 34 heats components around the cap heater 34 such as an upper surface of the cover 39, one or more heat insulation plates 40A among the heat insulation plates 40 and a lowermost wafer (bottom wafer) among the wafers 7 provided at a lower end of the boat 21. Hereinafter, the one or more heat insulation plates 40A may also be collectively or individually referred to as "heat insulation plates 40A" or a "heat insulation plate 40A". The cap heater 34 is configured to perform two functions: one of which is performing a heating process so as to compensate for the heat leaking from a furnace opening to thereby enhance an apparent heat insulation property of the heat insulation structure 22 to a significantly high level; and the other of which is uniformizing a temperature distribution on a surface of the bottom wafer. The former contributes to a temperature uniformity between the wafers 7. By performing the heating process in a temperature elevating step described later, the temperature distribution can be made close to a temperature distribution (temperature gradient distribution) in a temperature-stabilized steady state, and a temperature control of the heater 3 can converge faster.

As shown in FIG. 2, a heat absorber 56 with a predetermined emissivity is provided on an upper surface of the flange 4C, that is, a surface of the flange 4C opposite to the manifold 5. It is preferable that the emissivity of the heat absorber 56 is close to 1 (that is, close to that of the black body) in at least a partial wavelength range between a peak wavelength of a black body radiation at a heat resistant temperature of the O-ring 5A and a peak wavelength of the black body radiation at a temperature of a center portion of the reaction tube 4. The heat absorber 56 absorbs the radiant heat in the vicinity of the flange 4C before the light incident into the reaction tube 4 reaches the O-ring 5A due to multiple reflections or the like. As a result, the O-ring 5A between the flange 4C and the manifold 5 is protected from the heat. It is preferable that the heat absorber 56 is in close contact with the flange 4C, and the heat absorber 56 may be constituted by an elastic thin sheet. The heat absorber 56 may be interposed as a cushion between the flange 4C and a backing plate (not shown) configured to press the flange 4C against the manifold 5.

In addition, a heat insulation cloth 51 is provided above the flange 4C on an outer peripheral surface of the reaction tube 4 between the lid 19 and an end of the furnace 2 facing the lid 19. A heat shield sheet 53 is wrapped around an outside of the heat insulation cloth 51. By preventing the radiant heat from entering the inside of the reaction tube 4 from an outside of the reaction tube 4 by the heat insulation cloth 51 and the heat shield sheet 53, it is possible to stabilize an inner temperature of the furnace 2. The configuration described above is useful when reaction tubes including the reaction tube 4 capable of operating at different temperatures are located adjacent to each other. In addition, the heat leak in the furnace 2 at a location such as the bottom wafer where the temperature tends to be lowered can be prevented, a heat insulation performance can be improved, and a temperature stabilization time can be shortened.

The heat shield sheet 53 is a sheet made of a metal whose reflectivity is high (whose emissivity is low) such as molybdenum (Mo). When a surface of the sheet is flattened into a mirror shape, it is possible to reduce a vertical emissivity of the sheet. The sheet may be a laminate structure of a metal film and a resin film, and a thickness of the metal film is set such that infrared light does not transmit through the metal film. The sheet may be wrapped more than once.

Subsequently, a configuration of the heat insulation structure 22 will be described with reference to the drawings.

The heat insulation structure 22 is constituted by the heat insulation plate retainer 38, the cover 39 and the heat insulation plates 40, and is placed on the rotating table 37. The heat insulation structure 22 is arranged in the process chamber 6 between the boat 21 and the lid 19 in the vicinity of the furnace opening where a temperature gradient is formed. More specifically, it is preferable that an end of the heat insulation structure 22 facing an inner side of the reaction tube 4 is provided closer to a center of the reaction tube 4 than the other end of the heat insulation structure 22 facing the lid 19 of the furnace 2.

The heat insulation plate retainer 38 is of a cylindrical shape with a cavity in a center thereof, and the sub heater support column 33 penetrates the cavity of the heat insulation plate retainer 38. The heat insulation plate retainer 38 is provided substantially coaxially with an arrangement axis of the heat insulation plates 40, and supports the heat insulation plates 40 of a disk shape. A cylindrical portion 38A of the heat insulation plate retainer 38 is provided with a plurality of holders 38D of a collar shape configured to support the heat insulation plates 40. In addition, at a lower end of the heat insulation plate retainer 38, a pedestal 38C of an outward extending flange shape is provided. The pedestal 38C contacts with the rotating table 37 at a lower end thereof. The heat insulation plate retainer 38 may be made of a heat resistant material such as quartz.

The heat insulation plates 40 are arranged on the heat insulation plate retainer 38 with predetermined gaps therebetween. That is, in the heat insulation structure 22, the heat insulation plates 40 are provided with the predetermined gaps therebetween.

On the other hand, an upper end of the heat insulation plate retainer 38 is opened such that the sub heater support column 33 protrudes from the upper end of the heat insulation plate retainer 38, and is configured as a supply port 38B of the purge gas.

A first flow path, whose cross-section is of an annular shape and serving as a purge gas supply path through which the purge gas is supplied upward in the heat insulation structure 22, is provided between the heat insulation plate retainer 38 and the sub heater support column 33.

The purge gas supplied through the supply port 38B flows downward through a second flow path which is a space between the heat insulation plate retainer 38 and an inner wall of the cover 39, and is exhausted through a plurality of exhaust holes 22A, which are provided at a lower end of the cover 39, to an outside of the cover 39.

An upper end of the cover 39 is closed by a flat plate, and the boat 21 is installed on the flat plate. The upper end of the cover 39 is of a convex shape. In other words, a step is provided on an outer circumference of the upper surface of the cover 39 over the entire circumference, and a ring-shaped bottom plate of the boat 21 is fitted to the step. With such a configuration, it is possible to rotate the cover 39 and the boat 21 without rotating the cap heater 34.

Since a load of the boat 21 is not applied to a portion above the step on the upper surface of the cover 39, the portion above the step may be formed in an appropriate shape whose thickness is thin. The portion above the step may be subject to a forming process or may be made opaque, for example, to adjust a heating amount of the bottom wafer.

The cover 39 is made of a material such as quartz and ceramics, is provided substantially coaxially with the arrangement axis of the heat insulation plate 40. The cover 39 is configured to cover side surfaces and upper surfaces of the heat insulation plates 40. In addition, a side heat shield 54 of a cylindrical shape is embedded in a side surface of the cover 39. For example, the side heat shield 54 is configured as a sheet. Specifically, as the side heat shield 54, a metal sheet such as a molybdenum (Mo) sheet and a platinum (Pt) sheet and a ceramic sheet such as an alumina (AlO) sheet and a zirconia (ZrO) sheet may be used. Preferably, the side heat shield 54 is configured as the molybdenum sheet. More preferably, a surface of the side heat shield 54 is configured as a mirror surface. By configuring the surface of the side heat shield 54 as the mirror surface, it is possible to improve the reflectivity and it is also possible to improve a heat shield effect.

As shown in FIGS. 4A and 4B, as the heat insulation plates 40, the heat insulation plates 40A and a plurality of heat insulation plates 40B are arranged coaxially on the plurality of holders 38D of the heat insulation plate retainer 38. Hereinafter, the plurality of heat insulation plates 40B may also be collectively or individually referred to as "heat insulation plates 40B" or a "heat insulation plate 40B". The heat insulation plates 40A are supported by the heat insulation plate retainer 38 with predetermined gaps therebetween and the heat insulation plate 40B are supported by the heat insulation plate retainer 38 with predetermined gaps therebetween. The heat insulation plate 40A is provided on a region (which is an uppermost stage) of the heat insulation plate retainer 38 facing the cap heater 34, and the heat insulation plate 40B is provided below the heat insulation plate 40A.

A notch 40C of an elongated hole shape is cut in the heat insulation plate 40B in a radial direction thereof. A width of the notch 40C is set to be smaller than outer diameters of the plurality of holders 38D of the heat insulation plate retainer 38 such that the heat insulation plates 40B can be supported by the plurality of holders 38D, and the width of the notch 40 is set to be slightly greater than an outer diameter of the cylindrical portion 38A of the heat insulation plate retainer 38 such that the heat insulation plates 40B can be transferred to or from the cylindrical portion 38A. A length of the notch 40C is set to be greater than a radius of the heat insulation plate 40B by the width thereof. Then, when the heat insulation plates 40B are inserted into the plurality of holders 38D, respectively, notches including the notch 40C of the heat insulation plates 40B at each stage are misaligned from one another in a circumferential direction such that the notches 40C do not overlap with one another. By misaligning the notches 40C of the heat insulation plates 40B at each stage in a circumferential direction as described above, it is possible to reduce adverse effects of the notches 40C of the heat insulation plates 40B at each stage. In addition, since through-holes 50A (described later) in each stage are not arranged in a straight line, it is possible to easily reflect the light transmitted through the through-holes 50A by the heat insulation plate 40B in a lower stage, and it is also possible to improve the heat insulation property.

A hole 40D is provided in the heat insulation plate 40A in a center of the heat insulation plate 40A. A diameter of the hole 40D is set to be smaller than the outer diameters of the plurality of holders 38D of the heat insulation plate retainer 38 such that the heat insulation plates 40A can be supported by the plurality of holders 38D. By providing the hole 40D of a circular shape in the heat insulation plate 40A without providing a notch such as the notch 40C of the heat insulation plate 40B, it is possible to uniformize the heating to the bottom wafer. An inner diameter of the hole 40D is set to be smaller than an inner diameter of the cap heater 34 (for example, half or less).

The heat insulation plate 40A and the heat insulation plate 40B are of a disk shape whose diameter is smaller than the diameter of the wafer 7 and greater than an outer diameter of the cap heater 34 (for example, 1.5 times or more) such that the heat insulation plate 40A and the heat insulation plate 40B can be accommodated in the cover 39. An appropriate vertical temperature gradient within the heat insulation structure 22 can be formed by the heat insulation plate 40A and the heat insulation plate 40B. The heat insulation plate 40A reflects the radiant heat from the heater 3 and the cap heater 34, traps the heat above the heat insulation plate 40A within its original region, and also plays a role in flattening the temperature distribution on a surface of the wafer 7 (that is, the bottom wafer) placed at a lowermost end of the boat 21.

According to an example of the embodiments, the number of the heat insulation plates 40B is set to be equal to or larger than the number of the heat insulation plates 40A. By providing the heat insulation plate 40A at an upper region and the heat insulation plate 40B at a lower region as described above, the heat insulation plate 40A reflects the radiant heat from the cap heater 34 to insulate the heat insulation plate 40B. Then, by reflecting the light radiated from or transmitted through a heat insulation plate (that is, the heat insulation plate 40A or another heat insulation plate 40B provided above the aforementioned heat insulation plate 40B) by the heat insulation plate 40B at a distance from the wafer 7 to insulate the wafer 7, it is possible to improve a temperature responsiveness of the wafer 7, and it is also possible to shorten a temperature elevation time. The number and arrangement of the heat insulation plates 40A and the heat insulation plates 40B are not limited to the example described above, and can be optimized so as to minimize a heat flux passing through the heat insulation structure 22.

Figure 6A:
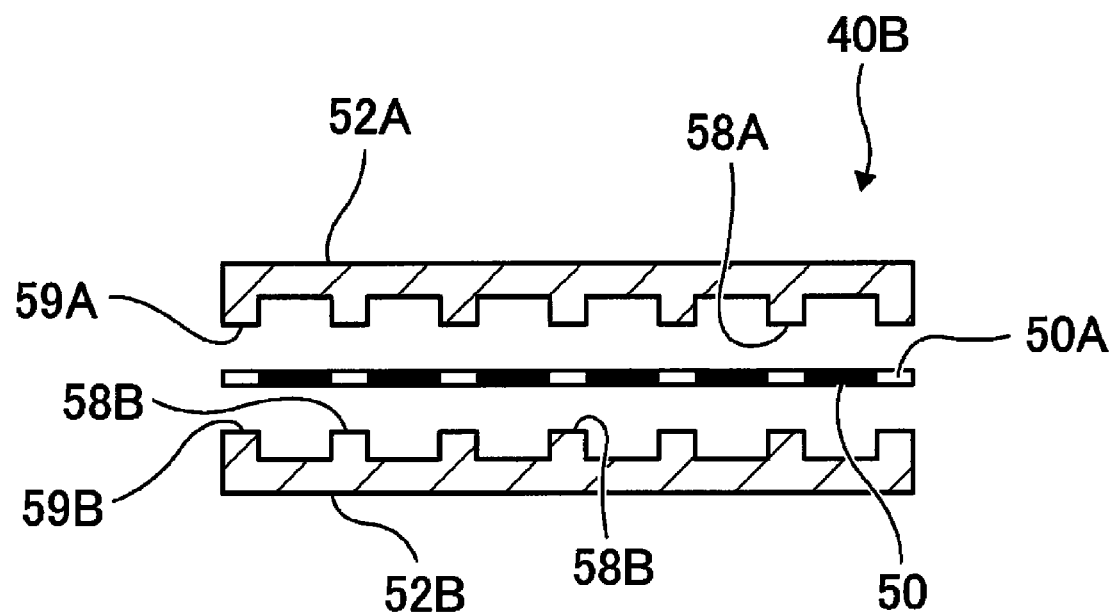
FIGS. 6A and 6B are diagrams schematically illustrating a vertical cross-section of the heat insulation plate for explaining a configuration of the heat insulation plate of the substrate processing apparatus preferably used in the embodiments of the present disclosure.
Figure 6B:
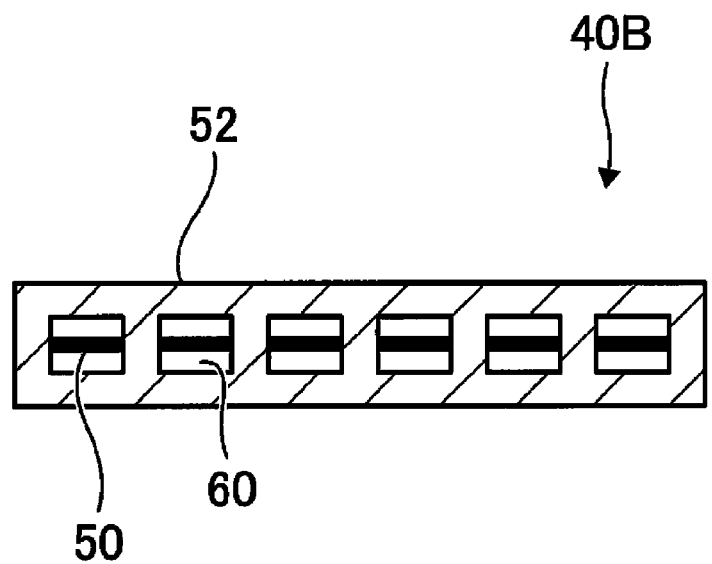

Subsequently, a configuration of the heat insulation plate 40 constituting the heat insulation structure 22 preferably used in the embodiments of the present disclosure will be described with reference to FIGS. 5A, 5B, 6A and 6B using the heat insulation plate 40B as an example. FIGS. 6A and 6B are diagrams schematically illustrating a vertical cross-section of a part of the heat insulation plate 40B.

The heat insulation plate 40B is constituted by a heat shield 50 and a pair of sealing plates 52A and 52B. The sealing plates 52A and 52B are of a disk shape and diameters of the sealing plates 52A and 52B are the same. The sealing plates 52A and 52B jointly serve as a seal 52 (also referred as a "casing" or an "envelope"). The heat shield 50 is thinner than each of the sealing plates 52A and 52B, and is set to be slightly smaller than outer diameters of the sealing plates 52A and 52B.

For example, the heat shield 50 is configured as a sheet. Specifically, as the heat shield 50, a metal sheet such as a molybdenum (Mo) sheet and a platinum (Pt) sheet and a ceramic sheet such as an alumina (AlO) sheet and a zirconia (ZrO) sheet may be used. Preferably, the heat shield 50 is configured as the molybdenum sheet. More preferably, a surface of the heat shield 50 is configured as a mirror surface. By configuring the surface of the heat shield 50 as the mirror surface, it is possible to improve the reflectivity and it is also possible to improve the heat shield effect. Further, the heat shield 50 is provided with the through-holes 50A of a square shape through which a front surface and a rear surface of the heat shield 50 communicate. The through-holes 50A may be of a circular shape.

The sealing plates 52A and 52B are made of a heat resistant and corrosion resistant material such as quartz and ceramics. The rigidity of each of the sealing plates 52A and 52B is set such that the sealing plates 52A and 52B do not bend due to their own weight, and the strength of each of the sealing plates 52A and 52B is set such that the sealing plates 52A and 52B can withstand a pressure difference of 1 atm or more. A surface of the each of the sealing plates 52A and 52B is configured as a mirror surface except for at least a portion where the sealing plates 52A and 52B are connected to each other. Protrusions slightly smaller than the through-holes 50A and of the same shapes as those of the through-holes 50A are provided on at least one of the sealing plates 52A and 52B at positions corresponding to the through-holes 50A of the heat shield 50, respectively. For example, protrusions 58A may be provided on the sealing plate 52A and protrusions 58B may be provided on the sealing plate 52B. In addition, a side wall whose height is the same as those of the protrusions such as the protrusions 58A and the protrusions 58B is provided on at least one of the sealing plates 52A and 52B over the entire circumference of an edge thereof including the notch 40C. For example, a side wall 59A may be provided on the sealing plate 52A and a side wall 59B may be provided on the sealing plate 52B. For example, the protrusions 58A and the protrusions 58B are arranged regularly (for example, in a grid pattern) while being aligned with one another, and a formation density thereof may be selected from 0.1 $cm^{-2}$ to 10 $cm^{-2}$.

As shown in FIGS. 6A and 6B, the heat insulation plate 40B is prepared by providing the heat shield 50 between the pair of sealing plates 52A and 52B. Specifically, the heat insulation plate 40B may be prepared by bonding the protrusions 58A and the protrusions 58B (and bonding the side wall 59A and the side wall 59B). The protrusions 58A and the protrusions 58B (and the side wall 59A and the side wall 59B) may be bonded by inserting either the protrusions 58A of the sealing plate 52A or the protrusions 58B of the sealing plate 52B into the through-holes 50A and performing a heat treatment while vacuum-evacuating so as to bond the protrusions 58A and the protrusions 58B (and the side wall 59A and the side wall 59B in a vacuum-tight manner). When preparing the heat insulation plate 40B, the heat shield 50 may not be welded to the sealing plates 52A and 52B, and a vacuum heat insulation layer may be formed on both surfaces of the heat shield 50. A process such as the heat treatment (welding), a laser welding and a vacuum bonding may be used for bonding the pair of sealing plates 52A and 52B to be integrated. Further, a vacuum evacuation process may be performed after welding. In such a case, a thin tube for sealing off may protrude vertically on either of the sealing plates 52A and 52B and may remain as a navel portion even after sealing. When stacking the heat insulation plates 40B as shown in FIG. 4B, it is possible to avoid the contact between adjacent navel portions by setting a stacking gap to be at least twice the height of the navel portion and by aligning an orientation of the notches 40C of the heat insulation plates 40B to match with a position of the navel portion.

That is, by arranging the heat shield 50 in a vacuum cavity 60 provided between the pair of sealing plates 52 and by arranging, across the vacuum cavity 60, columns bridging between the pair of sealing plates 52 in a predetermined pattern, it is possible to maintain the strength of the heat insulation plate 40B. The surfaces of the sealing plates 52A and 52B may be mirror-finished or may be sufficiently optically flat by a treatment such as a fire polishing treatment, and insides of the sealing plates 52A and 52B may be made transparent or opaque. When the insides of the sealing plates 52A and 52B are opaque by a treatment such as a bubble treatment, the strength may be lowered. However, the heat flux due to the transmission and conduction of the radiation can be reduced. In order to suppress the radiation transmitted through the protrusions 58A, the protrusions 58B (pillars) and the side walls 59A and 59B, an outer surface of the heat insulation plate 40B corresponding to the protrusions 58A, the protrusions 58B and the side walls 59A and 59B may be configured as a sandblast surface, or the inside of the heat insulation plate 40B may be configured as an opaque portion. In addition, the heat shield 50 may come into contact with the sealing plates 52A and 52B at points without being adhered to the sealing plates 52A and 52B on the surfaces of the sealing plates 52A and 52B. That is, the heat shield 50 may be supported without making a surface contact with the sealing plates 52A and 52B in the vacuum cavity 60. For example, the heat shield 50 embossed on both sides is supported by the sealing plate 52B, which is the bottom of the vacuum cavity 60, by a point contact with front ends (tips) of the downward protrusions such as the protrusions 58A.

Similarly, a vacuum cavity is also provided inside the heat insulation plate 40A and the side surface of the cover 39, and the heat shield 50 or the side heat shield 54 is arranged in each cavity.

According to the heat insulation plate 40 described above in which the vacuum cavity 60 is provided therein and the heat shield 50 is provided in the vacuum cavity 60, the heat conduction in a thickness direction thereof can be suppressed as compared with a heat insulation plate in which the vacuum cavity 60 is not provided. As a result, it is possible to improve the heat insulation performance per plate. In addition, by providing the side heat shield 54 on the side surface of the cover 39, it is possible to enhance the heat insulation property inside and outside the heat insulation structure 22, and it is also possible to improve the heat insulation property between the heat insulation plates 40 by reducing a view factor. Further, since the radiant heat from the cap heater 34 is reflected by a portion of the side heat shield 54 above the heat insulation plate 40A, it is possible to reflect the radiant heat onto the wafer 7 without leaking the radiant heat of the cap heater 34 to a lower portion of the process chamber 6.

Figure 7:
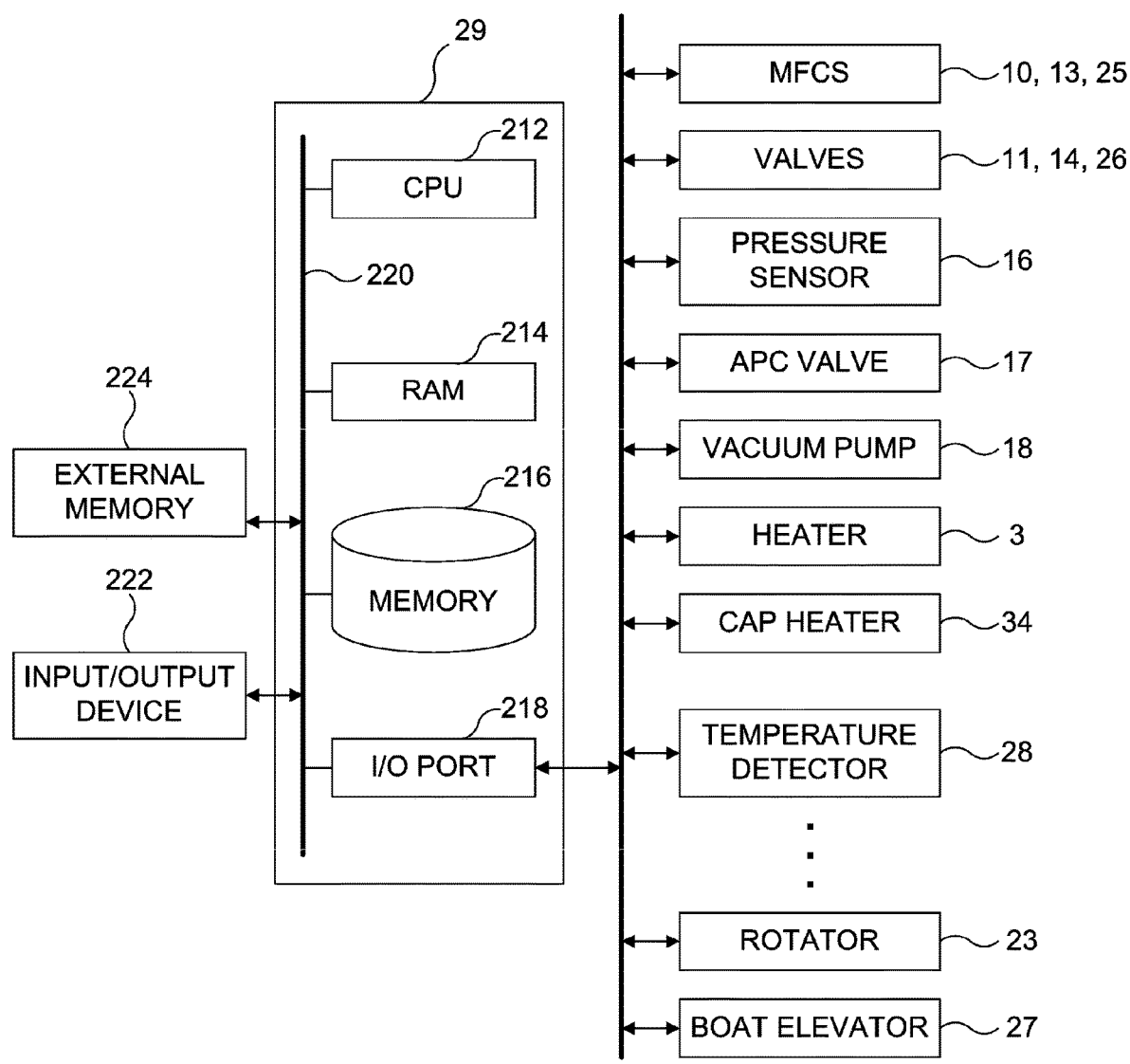
FIG. 7 is a block diagram schematically illustrating a configuration of a controller and related components of the substrate processing apparatus preferably used in the embodiments of the present disclosure.

As shown in FIG. 7, the controller 29 is electrically connected to the components of the substrate processing apparatus 1 such as the MFCs 10, 13 and 25, the valves 11, 14 and 26, the pressure sensor 16, the APC valve 17, the vacuum pump 18, the heater 3, the cap heater 34, the temperature detector 28, the rotator 23 and the boat elevator 27, and is configured to automatically control the components electrically connected thereto. The controller 29 is constituted by a computer including a CPU (Central Processing Unit) 212, a RAM (Random Access Memory) 214, a memory 216 and an I/O port 218. The RAM 214, the memory 216 and the I/O port 218 may exchange data with the CPU 212 through an internal bus 220. The I/O port 218 is connected to the components described above. For example, an input/output device 222 such as a touch panel is connected to the controller 29.

The memory 216 is configured by components such as a flash memory and a hard disk drive (HDD). For example, a control program for controlling the operation of the substrate processing apparatus 1 or a program (for example, a recipe such as a process recipe and a cleaning recipe) configured to control the components of the substrate processing apparatus 1 according to the process conditions to perform a substrate processing such as a film-forming process is readably stored in the memory 216. The RAM 214 functions as a memory area (work area) where a program or data read by the CPU 212 is temporarily stored.

The CPU 212 is configured to read the control program from the memory 216 and execute the read control program. In addition, the CPU 212 is configured to read the recipe from the memory 216 in accordance with an operation command inputted from the input/output device 222. According to the contents of the read recipe, the CPU 212 is configured to control the components of the substrate processing apparatus 1.

The controller 29 may be embodied by installing the above-described program stored in an external memory 224 in a non-transitory manner into a computer. For example, the external memory 224 may include a semiconductor memory such as a USB memory and a memory card, an optical disk such as a CD and a DVD and a hard disk drive (HDD). The memory 216 or the external memory 224 may be embodied by a non-transitory tangible computer-readable recording medium. Hereafter, the memory 216 and the external memory 224 may be collectively or individually referred to as "recording medium". Instead of the external memory 224, a communication means such as the Internet and a dedicated line may be used for providing the program to the computer.

Hereinafter, an exemplary sequence of the substrate processing of forming a film on a substrate (that is, the wafer 7) (hereinafter, also referred to as the film-forming process) using the substrate processing apparatus 1 described above, which is a part of a manufacturing process of a semiconductor device, will be described.

The exemplary sequence will be described by way of an example in which two or more nozzles are provided as the nozzle 8 (hereinafter, among the two or more nozzles, a nozzle through which hexachlorodisilane gas is supplied may be referred to as a nozzle 8a and a nozzle through which ammonia gas is supplied may be referred to as a nozzle 8b) and a silicon nitride film (hereinafter, also referred to as an "SiN film") is formed on the wafer 7 by supplying the hexachlorodisilane (HCDS) gas serving as a first process gas (source gas) through the nozzle 8a and supplying the ammonia (NH$_3$) gas serving as a second process gas (reactive gas) through the nozzle 8b. Hereinafter, the gas supply pipe 9, the MFC 10, the valve 11, the gas supply pipe 12, the MFC 13 and the valve 14 corresponding to the nozzle 8a may also be referred to as a gas supply pipe 9a, an MFC 10a, a valve 11a, a gas supply pipe 12a, an MFC 13a and a valve 14a, respectively, and the gas supply pipe 9, the MFC 10, the valve 11, the gas supply pipe 12, the MFC 13 and the valve 14 corresponding to the nozzle 8b may also be referred to as a gas supply pipe 9b, an MFC 10b, a valve lib, a gas supply pipe 12b, an MFC 13b and a valve 14b, respectively. In the following descriptions, operations of components constituting the substrate processing apparatus 1 are controlled by the controller 29.

According to the exemplary sequence of the present embodiments, the SiN film is formed on the wafer 7 by performing a cycle a predetermined number of times (at least once). For example, the cycle may include: supplying the HCDS gas to the wafer 7 in the process chamber 6; removing the HCDS gas (residual gas) from the process chamber 6; supplying the NH$_3$ gas to the wafer 7 in the process chamber 6; and removing the NH$_3$ gas (residual gas) from the process chamber 6. In the present specification, the exemplary sequence of the film-forming process according to the present embodiments may be represented for simplicity's sake as follows:

(HCDS→NH$_3$)×$n$=>SiN

Wafer Charging and Boat Loading Step

The wafers 7 are charged (transferred) into the boat 21 (wafer charging step). After the boat 21 is charged with the wafers 7, the boat 21 is elevated by the boat elevator 27 and loaded (transferred) into the process chamber 6 (boat loading step). With the boat 21 loaded, the lid 19 airtightly closes (or seals) the lower end of the manifold 5 via the O-ring 19A. From a standby state before the wafer charging step, the valve 26 may be opened to supply a small amount of the purge gas into the cover 39.

Pressure Adjusting Step

An inside of the process chamber 6, that is, a space in which the wafers 7 are accommodated, is vacuum-exhausted (decompression-exhausted) by the vacuum pump 18 until the inner pressure of the process chamber 6 reaches a predetermined pressure (vacuum degree). In the pressure adjusting step, the inner pressure of the process chamber 6 is measured by the pressure sensor 16, and the APC valve 17 is feedback-controlled based on the measured pressure information. The purge gas is continuously supplied into the cover 39 and the operation of the vacuum pump 18 is continuously performed until at least the processing of the wafer 7 is completed.

Temperature Elevating Step

After the inner atmosphere (for example, oxygen) of the process chamber 6 is sufficiently exhausted from the process chamber 6, the inner temperature of the process chamber 6 is elevated. The states of the electric conduction to the heater 3 and the cap heater 34 are feedback-controlled based on the temperature information detected by the temperature detector 28 so as to obtain a desired temperature distribution of the inner temperature of the process chamber 6 adapted to performing a film-forming step described later. The heater 3 and the cap heater 34 continuously heat the process chamber 6 until at least the processing (the film-forming process) of the wafer 7 is completed. The time duration of supplying the electrical power to the cap heater 34 may not be equal to the time duration of supplying the electrical power to the heater 3. For example, immediately before the start of the film-forming step, it is preferable that a temperature of the cap heater 34 reaches the same temperature as a film-forming temperature, and an inner surface temperature of the manifold 5 reaches 180° C. or higher (for example, 260° C.). When heating the process chamber 6 immediately before the start of the film-forming step, it is possible to shorten the time that the O-ring 19A is exposed to high temperature, and it is also possible to extend a life of the O-ring 19A.

In the temperature elevating step, the boat 21 and the wafers 7 are rotated by the rotator 23. The boat 21 is rotated by the rotator 23 via the rotating shaft 36, the rotating table 37 and the cover 39. Therefore, it is possible to rotate the wafers 7 without rotating the cap heater 34. Thereby, it is possible to reduce uneven heating. The rotator 23 continuously rotates the boat 21 and the wafers 7 until at least the processing of the wafer 7 is completed.

Film-Forming Step

After the inner temperature of the process chamber 6 is stabilized at a predetermined processing temperature, the film-forming step is performed by repeatedly performing a first step through a fourth step described below sequentially. In addition, before starting the first step, the valve 26 may be opened to increase the supply of the purge gas.

First Step: Source Gas Supply Step

In the first step, the HCDS gas is supplied to the wafer 7 in the process chamber 6. By opening the valve 11a and the valve 14a, the HCDS gas is supplied into the gas supply pipe 9a and the $N_2$ gas is supplied into the gas supply pipe 12a. Flow rates of the HCDS gas and the $N_2$ gas are adjusted by the MFCs 10a and 13a, respectively. The HCDS gas and the $N_2$ gas with the flow rates thereof adjusted respectively are supplied to the wafer 7 in the process chamber 6 through the nozzle 8a, and are exhausted through the exhaust pipe 15. By supplying the HCDS gas to the wafer 7, a silicon-containing layer whose thickness is, for example, within a range from a single atomic layer or less to several atomic layers is formed as a first layer on an outermost surface of the wafer 7.

Second Step: Source Gas Exhaust Step

After the first layer is formed, the valve 11a is closed to stop the supply of the HCDS gas into the process chamber 6. In the second step, by maintaining the APC valve 17 open, the vacuum pump 18 vacuum-exhausts the inner atmosphere of the process chamber 6 to remove the HCDS gas remaining in the process chamber 6 which did not react or which contributed to the formation of the first layer from the process chamber 6. In addition, by maintaining the valve 14a open, the $N_2$ gas may be supplied to purge the gas supply pipe 9a, the nozzle 8a and the inside of the process chamber 6.

Third Step: Reactive Gas Supply Step

In the third step, the $NH_3$ gas is supplied to the wafer 7 in the process chamber 6. The valves 11b and 14b are controlled in the same manner as the valves 11a and 14a in the first step. Flow rates of the $NH_3$ gas and the $N_2$ gas are adjusted by MFCs 10b and 13b, respectively. The $NH_3$ gas and the $N_2$ gas with the flow rates thereof adjusted respectively are supplied to the wafer 7 in the process chamber 6 through the nozzle 8b, and are exhausted through the exhaust pipe 15. The $NH_3$ gas supplied to the wafer 7 reacts with at least a portion of the first layer (that is, the silicon-containing layer) formed on the wafer 7 in the first step. As a result, the first layer is modified (nitrided) into a second layer containing silicon (Si) and nitrogen (N), that is, a silicon nitride layer (SiN layer).

Fourth Step: Reactive Gas Exhaust Step

After the second layer is formed, the valve 11b is closed to stop the supply of the $NH_3$ gas into the process chamber 6. Similar to the second step, the vacuum pump 18 vacuum-exhausts the inner atmosphere of the process chamber 6 to remove the by-products or the $NH_3$ gas remaining in the process chamber 6 which did not react or which contributed to the formation of the second layer from the process chamber 6.

By performing the cycle wherein the first step through the fourth step described above are performed non-simultaneously (without overlapping) a predetermined number of times (n times), the SiN film is formed on the wafer 7 with a predetermined composition and a predetermined thickness. In addition, it is preferable that the cycle described above is repeatedly performed a plurality number of times.

For example, the process conditions for the exemplary sequence of the substrate processing are as follows:

The processing temperature (wafer temperature): 250° C. to 700° C.;

The processing pressure (the inner pressure of the process chamber): 1 Pa to 4,000 Pa;

The flow rate of the HCDS gas: 1 sccm to 2,000 sccm;

The flow rate of the $NH_3$ gas: 100 sccm to 10,000 sccm;

The flow rate of the $N_2$ gas (to the nozzles): 100 sccm to 10,000 sccm; and

The flow rate of the $N_2$ gas (to the rotating shaft): 100 sccm to 500 sccm.

By selecting suitable values within these process conditions described above, it is possible to perform the substrate processing (film-forming process) properly.

A thermally decomposable gas such as the HCDS may form a film of the by-products on a surface of a metal more easily than on a surface of quartz. The film of the by-products containing materials such as silicon oxide (SiO) and silicon oxynitride (SiON) may be easily adhered to a surface exposed to the HCDS gas (and the ammonia gas), particularly when a temperature of the surface is 260° C. or lower.

Purging and Returning to Atmospheric Pressure Step

After the film-forming step is completed, by opening the valves 14a and 14b, the $N_2$ gas is supplied into the process chamber 6 through each of the gas supply pipes 12a and 12b, and then the $N_2$ gas supplied into the process chamber 6 is exhausted through the exhaust pipe 15. Thereby, the inner atmosphere of the process chamber 6 is replaced with the $N_2$ gas which is the inert gas (substitution by inert gas), and thus the gas such as the source gas remaining in the process chamber 6 or the reaction by-products remaining in the process chamber 6 are removed (purged) from the process chamber 6 (purging step). Thereafter, the APC valve 17 is closed, and the $N_2$ gas is filled in the process chamber 6 until the inner pressure of the process chamber 6 reaches a normal pressure (returning to atmospheric pressure step).

Boat Unloading and Wafer Discharging Step

Thereafter, the lid 19 is lowered by the boat elevator 27 and the lower end of the manifold 5 is opened. The boat 21 with the processed wafers 7 charged therein is unloaded out of the reaction tube 4 through the lower end of the manifold 5 (boat unloading step). Then, the processed wafers 7 are transferred (discharged) from the boat 21 (wafer discharging step).

According to the present embodiments, it is possible to provide at least one or more of the following effects.

(a) By providing the vacuum cavity in the heat insulation plate 40 and by embedding the heat shield whose reflectivity is high in the vacuum cavity, it is possible to reflect the radiant heat, and it is also possible to improve the heat insulation performance in the process chamber.

(b) Therefore, it is possible to shorten the temperature stabilization time in the process chamber, and it is also possible to improve a uniformity of the wafer on the surface of the wafer.

(c) Specifically, by disposing the heat insulation plate 40 below the cap heater 34, wherein the vacuum cavity is provided in the heat insulation plate 40 and the heat shield 50 is embedded in the vacuum cavity, it is possible to retain the radiant heat of the cap heater 34 in the furnace to suppress the heat leak at the lower portion of the process chamber 6.

(d) In addition, by providing the side heat shield 54 on the side surface of the cover 39 covering the heat insulation plate 40, it is possible to reflect the radiant heat of the cap heater 34 on the wafer 7 without leaking the radiant heat of the cap heater 34 to the lower portion of the process chamber 6.

(e) In addition, by wrapping the heat insulation cloth 51 around the furnace opening of the reaction tube 4 and further covering it with the heat insulation sheet 53, it is possible to improve the heat insulation performance at the location where the temperature tends to be lowered such as the bottom wafer, and it is also possible to shorten temperature stabilization time in the process chamber 6. In addition, it is possible to stabilize the inner temperature of the furnace by reflecting the radiant heat from an outside to the inside of the furnace.

(f) In addition, by providing the heat absorber 56 on the upper surface of the flange 4C, it is possible to absorb the radiant heat in the vicinity of the flange 4C, and it is also possible to protect the seal between the flange 4C and the manifold 5.

(g) In addition, it is possible to improve the heat insulation performance with the same number of sheets as in the conventional configuration. Further, when trying to maintain the same heat insulation performance as in the conventional configuration, it is possible to reduce the number of the heat insulation plates 40. In addition, those skilled in the art will understand that the heat shield of the quartz cover in the above-described embodiments can be placed above an uppermost heat insulation plate, and the heat shield of the quartz cover below the uppermost heat insulation plate may be omitted or the heat shield of the quartz cover below the uppermost heat insulation plate may be replaced with opaque quartz.

Those skilled in the art will also understand that a plurality of heat shields including the heat shield 50 may be stacked (or laminated) and provided in the vacuum cavity 60 of the heat insulation plate 40.

While the technique of the present disclosure is described in detail by way of the embodiments described above, the above-described technique is not limited thereto. The above-described technique may be modified in various ways without departing from the scope thereof.

According to some embodiments of the present disclosure, it is possible to provide the technique capable of shortening the temperature stabilization time of the process chamber by improving the heat insulation performance of the lower portion of the process chamber.

What is claimed is:

1. A heat insulation structure arranged in a vicinity of a furnace opening of a heat treatment furnace wherein a temperature gradient is formed at the vicinity of the furnace opening, comprising:
a plurality of heat insulation plates with predetermined gaps therebetween,
wherein each heat insulation plate comprises:
a heat shield made of a metal; and
a seal constituted by a pair of sealing plates and made of quartz or ceramics, and configured to cover a front surface and a rear surface of the heat shield,
wherein the heat shield is arranged in a vacuum cavity provided in the seal, and
wherein the heat shield of each of the heat insulation plates is provided with at least one through-hole through which the front surface of the heat shield is in communication with the rear surface of the heat shield, and the pair of sealing plates are connected to each other at an entire circumference of each of the pair of sealing plates and in the at least one through-hole.

2. The heat insulation structure of claim 1, wherein each of the pair of sealing plates is of a disk shape, and the heat shield is thinner than each of the pair of sealing plates.

3. A heat insulation structure arranged in a vicinity of a furnace opening of a heat treatment furnace wherein a temperature gradient is formed at the vicinity of the furnace opening, comprising:
a plurality of heat insulation plates with predetermined gaps therebetween,
wherein each heat insulation plate comprises:
a heat shield made of a metal; and
a seal constituted by a pair of sealing plates and made of quartz or ceramics, and configured to cover a front surface and a rear surface of the heat shield, the pair of sealing plates being connected to each other over an entire circumference of each of the pair of sealing plates, and
wherein the heat shield of each of the plurality of heat insulation plates is supported in a vacuum cavity provided in the seal without making a surface contact with the pair of sealing plates so that the heat shield is arranged in the vacuum cavity.

4. The heat insulation structure of claim 3, wherein the heat shield of each of the plurality of heat insulation plates is embossed.

5. The heat insulation structure of claim 3, wherein the heat shield of each of the plurality of heat insulation plates is provided with a plurality of through-holes arranged regularly.

6. The heat insulation structure of claim 1, wherein a rigidity of each of the pair of sealing plates is set such that the pair of sealing plates do not bend due to their own weight, and a surface of each of the pair of sealing plates is configured as a mirror surface except for at least a portion where the pair of sealing plates are connected to each other.

7. The heat insulation structure of claim 1, wherein a surface of the heat shield of each of the plurality of heat insulation plates is configured as a mirror surface.

8. The heat insulation structure of claim 1, further comprising:
a heat insulation plate retainer arranged coaxially with an arrangement axis of the plurality of heat insulation plates and configured to support the plurality of heat insulation plates; and
a cover of a cylindrical shape made of quartz or ceramics, arranged coaxially with the arrangement axis of the plurality of heat insulation plates and configured to cover the plurality of heat insulation plates,
wherein a side heat shield of a cylindrical shape is embedded in a side surface of the cover.

9. A substrate processing apparatus comprising:
a process vessel of a cylindrical shape in which a substrate is processed; and
the heat insulation structure of claim 1.

10. A heat insulation structure arranged in a vicinity of a furnace opening of a heat treatment furnace wherein a temperature gradient is formed at the vicinity of the furnace opening, comprising:
a plurality of heat insulation plates with predetermined gaps therebetween,
wherein each heat insulation plate comprises:
a heat shield made of a metal; and
a seal constituted by a pair of sealing plates and made of quartz or ceramics, and configured to cover a front surface and a rear surface of the heat shield,
wherein the heat shield is arranged between the pair of sealing plates, and
wherein the heat shield of each of the heat insulation plates is provided with at least one through-hole through which the front surface of the heat shield is in communication with the rear surface of the heat shield, and the pair of sealing plates are connected to each other at an entire circumference of each of the pair of sealing plates and in the at least one through-hole.

* * * * *